(12) United States Patent
Kimura et al.

(10) Patent No.: US 9,593,409 B2
(45) Date of Patent: *Mar. 14, 2017

(54) DIELECTRIC FILM FORMING APPARATUS AND METHOD FOR FORMING DIELECTRIC FILM

(71) Applicant: ULVAC, Inc., Chigasaki-shi, Kanagawa (JP)

(72) Inventors: Isao Kimura, Susono (JP); Takehito Jinbo, Chigasaki (JP); Hiroki Kobayashi, Chigasaki (JP); Youhei Endou, Susono (JP); Youhei Oonishi, Susono (JP)

(73) Assignee: ULVAC, INC., Chigasaki-shi (JP)

( * ) Notice: Subject to any disclaimer, the term of this patent is extended or adjusted under 35 U.S.C. 154(b) by 890 days.

This patent is subject to a terminal disclaimer.

(21) Appl. No.: 13/857,402

(22) Filed: Apr. 5, 2013

(65) Prior Publication Data

US 2013/0228453 A1 Sep. 5, 2013

Related U.S. Application Data

(63) Continuation of application No. PCT/JP2011/072804, filed on Oct. 3, 2011.

(30) Foreign Application Priority Data

Oct. 6, 2010 (JP) .................................. 2010-227009

(51) Int. Cl.
*C23C 14/35* (2006.01)
*C23C 14/34* (2006.01)
(Continued)

(52) U.S. Cl.
CPC ........ *C23C 14/3464* (2013.01); *C23C 14/088* (2013.01); *C23C 14/35* (2013.01);
(Continued)

(58) Field of Classification Search
CPC ... C23C 14/088; C23C 14/35; C23C 14/3464; C30B 23/002; C30B 23/025; C30B 23/063; C30B 23/032; C30B 29/32
(Continued)

(56) References Cited

U.S. PATENT DOCUMENTS 4,911,809 A * 3/1990 Wort ...................... C23C 14/352
204/192.11
5,744,016 A * 4/1998 Yamada .............. C23C 14/0068
204/192.12

FOREIGN PATENT DOCUMENTS

JP H5-17147 1/1993
JP H10-102234 A1 4/1998
(Continued)

OTHER PUBLICATIONS

Shintani, Yoshihiro, et al., "Pb(Zr•Ti)O₃ Films by RF Sputtering in PbO Vapour," Japan J. Appl. Phys. vol. 17 (1978), No. 3, pp. 573-574.
(Continued)

*Primary Examiner* — Rodney McDonald
(74) *Attorney, Agent, or Firm* — Kratz, Quintos & Hanson, LLP

(57) ABSTRACT

A dielectric film forming apparatus and a method for forming a dielectric film so as to form a dielectric film with a (100)/(001) orientation. A dielectric film forming apparatus includes a deposition preventive plate heating portion that heats a deposition preventive plate disposed in a position where particles discharged from a target adhere. Sputtering gas is introduced from a sputtering gas introduction unit into a vacuum chamber. The deposition preventive plate is heated to a temperature higher than a film forming temperature so as to emit vapor from a thin film adhered to the deposition preventive plate. After a seed layer is formed on a substrate, the substrate is heated to the film forming temperature, and
(Continued)

AC voltage is applied to the target from a power supply and then, the target is sputtered so as to form a dielectric film on the substrate.

4 Claims, 4 Drawing Sheets

(51) Int. Cl.
- *C23C 14/08* (2006.01)
- *C30B 23/00* (2006.01)
- *C30B 23/02* (2006.01)
- *C30B 23/06* (2006.01)
- *C30B 29/32* (2006.01)

(52) U.S. Cl.
CPC .......... *C30B 23/002* (2013.01); *C30B 23/025* (2013.01); *C30B 23/063* (2013.01); *C30B 29/32* (2013.01)

(58) Field of Classification Search
USPC ........................... 204/192.11, 192.18, 298.11
See application file for complete search history.

(56) References Cited

FOREIGN PATENT DOCUMENTS

| JP | H11-229132 A1 | 8/1999 |
| JP | 2003-81694 A1 | 3/2003 |
| JP | 2007-42818 A1 | 2/2007 |
| JP | 2007-308782 A1 | 11/2007 |
| JP | 2007-327106 A1 | 12/2007 |
| JP | 2010-84180 A1 | 4/2010 |

OTHER PUBLICATIONS

Notification of Reason(s) for Refusal dated Sep. 2, 2014, in the corresponding Japanese patent application No. 2012-537708, with English translation.

International Search Report for International Application No. PCT/JP2011/072804 dated Nov. 15, 2011.

International Preliminary Report on Patentability dated May 16, 2013 issued in counterpart application No. PCT/JP2011/072804 (7 pages).

* cited by examiner

US 9,593,409 B2

DIELECTRIC FILM FORMING APPARATUS AND METHOD FOR FORMING DIELECTRIC FILM

BACKGROUND

The present invention generally relates to a dielectric film forming apparatus and a method for forming a dielectric film.

Currently, a piezoelectric element using a ferroelectric material (such as, lead zirconate titanate ($Pb(Zr, Ti)O_3$, PZT) or the like) is applied to MEMS (a micro electro mechanical systems) technique (such as, an inkjet head and an acceleration sensor).

FIG. 4 is a graph showing piezoelectric characteristics of a PZT thin film having a (100)/(001) orientation and a PZT thin film having a (111) orientation. The PZT thin film having (100)/(001) orientation is known to show a piezoelectric characteristic greater than the piezoelectric characteristic of the PZT thin film with the (111) orientation.

FIG. 6 is an internal configuration diagram of a conventional dielectric film forming apparatus 110.

The dielectric film forming apparatus 110 includes a vacuum chamber 111, a target 121 for PZT provided in the vacuum chamber 111, a substrate holding pedestal 132 for holding a substrate 131 provided on a position facing to the target 121, a substrate heating portion 118 for heating the substrate 131, a sputtering power supply 113 applying electric voltage to the target, a sputtering gas introduction unit 114 for introducing sputter gas into the vacuum chamber 111, and first and second deposition preventive plates 134 and 135 provided in the vacuum chamber where particles discharged from the target 121 have adhered to.

In a case where a piezoelectric element is formed, a Si substrate having a thermally-oxidized film on which a Ti thin film as an adhesive layer and a noble metal thin film as a lower electrode layer are preliminarily laminated in this order is used as the substrate 131 to be film-formed. The noble metal thin film is a Pt or Ir thin film preferentially oriented to a (111) plane.

The substrate heating portion 118 includes a heat generating member 133 and a heating power supply 117. The heat generating member 133 is disposed at the opposite side of the substrate 131 on the substrate holding pedestal 132. The heating power supply 117 is electrically connected to the heat generating member 133.

When a direct current flows from the heating power supply 117 to the heat generating member 133, the heat generating member 133 generates heat and then the substrate 131 on the substrate holding pedestal 132 is heated.

FIG. 7 shows a temperature change of the heat generating member 133 in a film forming method using the conventional dielectric film forming apparatus 110.

First, the heat generating member 133 is heated to be a film forming temperature of 640 degrees Celsius and hold the temperature.

A cathode electrode 122 is closely adhered to and fixed onto the back side of the target 121 at the opposite side of the substrate holding pedestal 132. The sputtering power supply 113 is electrically connected to the cathode electrode 122.

Sputtering gas is introduced into the vacuum chamber 111 from the sputtering gas introduction unit 114; and an AC voltage is applied to the target 121 through the cathode electrode 122 from the sputtering power supply 113, the introduced sputtering gas being ionized so as to form plasma. Ions in the plasma sputter a surface of the target 121; and PZT particles are discharged from the target 121.

A part of PZT particles discharged from the target 121 enters a surface of the heated substrate 131; thus, a PZT thin film is formed on the noble metal thin film of the substrate 131.

After the PZT thin film having a predetermined film thickness is formed, the voltage applied from the sputtering power supply 113 is stopped and introduction of the sputtering gas is halted. The temperature of heat generating member 133 is lowered to 400 degrees Celsius that is a temperature lower than the temperature of during the film formation, and then, the film formation step is completed.

FIG. 8 shows X-ray diffraction patterns of three portions of the center portion (Center), the edge portion (Edge), and the middle portion (Middle) between the center portion and the edge portion in a PZT thin film formed on a Pt thin film using the conventional dielectric film forming apparatus 110. It is to be understood that the PZT thin film to be formed is preferentially oriented in a (111) direction.

In other words, in the conventional dielectric film forming apparatus, there has been a problem in that it is difficult to form a dielectric film having a (100)/(001) orientation. See examples such as, JPA No. 2007-327106, JPA No. 2010-084180 and JPA No. 2003-081694.

SUMMARY OF THE INVENTION

The present invention has been made to solve the above-discussed problems of the conventional technique; and it is an object of the present invention to provide a dielectric film forming apparatus and a method for forming a dielectric film that forms a dielectric film having a (100)/(001) orientation.

The inventors estimated that in the conventional dielectric film forming apparatus, the lack of Pb may have occurred due to diffusion of Pb in a direction of the noble metal thin film and re-evaporation of Pb at the beginning of the formation of the PZT thin film and $TiO_2$ is then formed; and thus, a PZT thin film formed on a $TiO_2$/noble metal thin film was preferentially oriented in a (111) direction. The inventors have found that to achieve the above-described object, a seed layer of PbO is to be preliminarily formed on the noble metal thin film.

The present invention is a dielectric film forming apparatus including a vacuum chamber, a target disposed inside of the vacuum chamber, a substrate holding pedestal for holding the substrate and the substrate holding pedestal is disposed in a position facing the target, a substrate heating portion for heating the substrate supported by the substrate holding pedestal, a sputtering power supply for applying a voltage to the target and a sputtering gas introduction unit for introducing sputtering gas into the vacuum chamber. The dielectric film forming apparatus for forming a dielectric film on the substrate by sputtering the target, further including an element source holder disposed inside the vacuum chamber, the element source holder holding an element source formed of a metal compound which contains an element included in the target in chemical structure of the metal compound, and an element source heating portion for heating the element source held by the element source holder, and the element source is configured to emit vapor when heated.

The present invention is the dielectric film forming apparatus, wherein the target is formed of lead zirconate titanate (PZT), and the element source contains Pb and O in a chemical structure, and the element source emits PbO vapor when heated.

The present invention is the dielectric film forming apparatus wherein the element source is disposed in a position where particles discharged from the target adhere.

The present invention is a dielectric film forming apparatus including a vacuum chamber, a target disposed inside the vacuum chamber, a substrate holding pedestal for holding the substrate, the substrate holding pedestal disposed in a position facing the target, a substrate heating portion for heating the substrate supported by the substrate holding pedestal, a sputtering power supply for applying a voltage to the target, a sputtering gas introduction unit for introducing sputtering gas into the vacuum chamber, and a deposition preventive plate disposed in a position where particles discharged from the target adhere inside the vacuum chamber. The dielectric film forming apparatus for forming a dielectric film on the substrate by sputtering the target, further including a deposition preventive plate heating portion for heating the deposition preventive plate.

The present invention is the dielectric film forming apparatus, wherein the target is formed of lead zirconate titanate (PZT).

The present invention is the dielectric film forming apparatus, wherein the deposition preventive plate has a ring shape, and the deposition preventive plate is disposed so as to surround an outside of an outer periphery of the substrate, the substrate being held by the substrate holding pedestal.

The present invention is a method for forming a dielectric film using a dielectric film forming apparatus including a vacuum chamber, a target disposed inside the vacuum chamber, a substrate holding pedestal for holding substrate, disposed in a position facing the target, a substrate heating portion for heating the substrate supported by the substrate holding pedestal, a sputtering power supply for applying a voltage to the target, a sputtering gas introduction unit for introducing sputtering gas into the vacuum chamber, a deposition preventive plate disposed in a position where particles discharged from the target adhere inside the vacuum chamber, and a deposition preventive plate heating portion for heating the deposition preventive plate. The method includes the steps of preliminarily determining a film forming temperature; forming a seed layer, wherein the step of forming the seed layer includes the steps of introducing sputtering gas into the vacuum chamber from the sputtering gas introduction unit, heating the deposition preventive plate to a temperature higher than a film forming temperature and emitting vapor from a thin film adhered to the deposition preventive plate so as to form a seed layer on the substrate; and forming a film, wherein the step of forming the film includes the steps of setting the substrate to be the film forming temperature, applying a voltage to the target from the sputtering power supply, and sputtering the target so as to form a dielectric film on the seed layer of the substrate.

The dielectric film having the (100)/(001) orientation can be formed on the Pt or Ir thin film having the (111) orientation, so that the present invention provides a piezoelectric element having a piezoelectric characteristic larger than the conventional configuration.

In a case where the element source which emits vapor when heated is disposed in the position where sputtered particles adhere, the element source does not disappear even if film formation is repeated; and thus, repeated formation of the dielectric film having the (100)/(001) orientation is allowed to occur.

DETAILED DESCRIPTION OF EMBODIMENTS

<First Example of the Dielectric Film Forming Apparatus>

A description will be given of a structure in a first example of the dielectric film forming apparatus according to the present invention.

Figure 1:
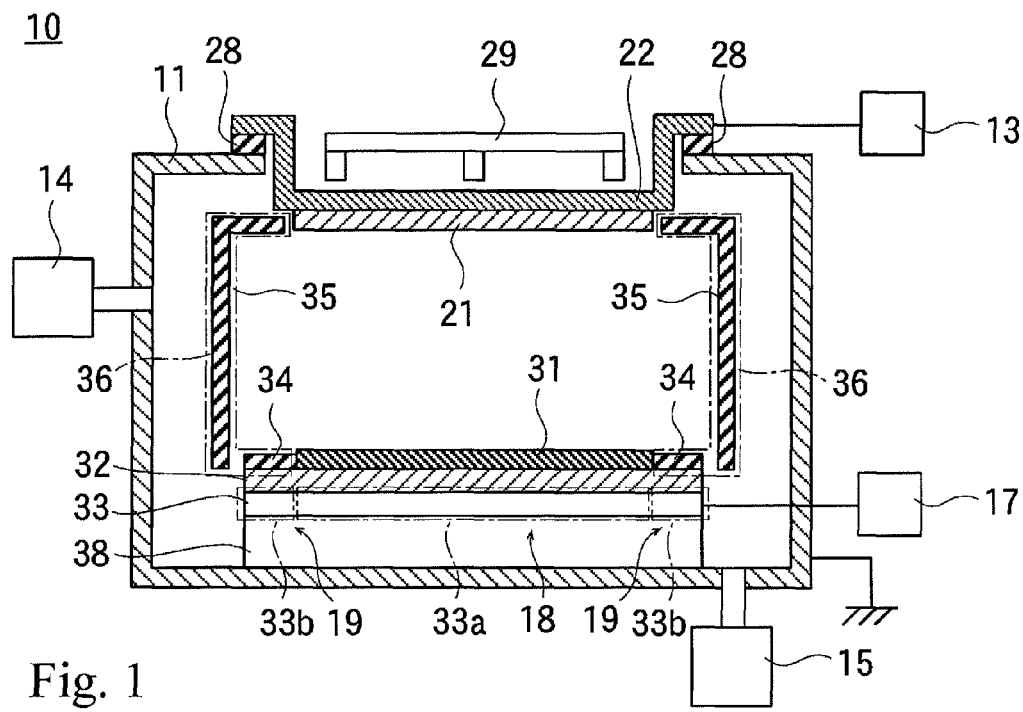
FIG. 1 is an internal configuration diagram showing a first example of a dielectric film forming apparatus according to the present invention.

FIG. 1 is an internal configuration diagram showing a dielectric film forming apparatus 10 in the first example.

The dielectric film forming apparatus 10 includes a vacuum chamber 11, a target 21 provided in the vacuum chamber 11, a substrate holding pedestal 32 for holding a substrate 31 provided on a position facing the target 21, a substrate heating portion 18 for heating the substrate 31 held on the substrate holding pedestal 32, a sputtering power supply 13 applying electric voltage to the target 21, a sputtering gas introduction unit 14 for introducing a sputtering gas inside the vacuum chamber 11, and a deposition preventive plate 36 provided in the vacuum chamber at a position where particles discharged from the target 21 adhere in the vacuum chamber.

Here, the target 21 is formed of lead zirconate titanate (PZT).

On a wall surface of the vacuum chamber 11, a cathode electrode 22 is mounted via an insulating member 28. The cathode electrode 22 and the vacuum chamber 11 are electrically insulated from each other. The vacuum chamber 11 is set to the ground potential.

A surface of the cathode electrode 22 is exposed inside the vacuum chamber 11. The target 21 is fixed in close contact with the center portion of the surface of the cathode electrode 22. The target 21 and the cathode electrode 22 are electrically connected to each other.

The sputtering power supply 13 is disposed outside of the vacuum chamber 11 and electrically connected to the cathode electrode 22. The sputtering power supply 13 applies an AC voltage to the target 21 through the cathode electrode 22.

A magnet unit 29 is disposed at the side of the cathode electrode 22 opposite to the target 21. The magnet unit 29 generates magnetic lines on the surface of the target 21.

Here, the substrate holding pedestal 32 is formed of silicon carbide (SiC). An outer periphery of the substrate holding pedestal 32 is formed larger than an outer periphery of the substrate 31, and a surface of the substrate holding pedestal 32 faces the surface of the target 21. The center portion of the surface of the substrate holding pedestal 32 electrostatically chuck so as to hold the substrate 31.

When the substrate 31 is electrostatically chucked on the center portion of the surface of the substrate holding pedestal 32, a back side of the substrate 31 is brought into close contact with the center portion of the surface of the substrate holding pedestal 32. The substrate 31 is thermally connected to the substrate holding pedestal 32.

The substrate heating portion 18 includes a first heat generating portion 33a and a heating power supply 17.

Here, the first heat generating portion 33a is made of SiC, and disposed on the substrate holding pedestal 32 at the opposite side of the substrate 31. The heating power supply 17 is electrically connected to the first heat generating portion 33a. When a direct current flows from the heating power supply 17 to the first heat generating portion 33a, the first heat generating portion 33a generates heat and then, the substrate 31 on the substrate holding pedestal 32 is heated.

The back side of the substrate 31 is brought into close contact with the center portion of the surface of the substrate holding pedestal 32; and heat transfer occurs equally from the center portion to the edge portion of the substrate 31.

The sputtering gas introduction unit 14 is connected to the wall surface of the vacuum chamber 11 so as to introduce sputtering gas inside the vacuum chamber 11.

Here, the deposition preventive plate 36 includes first and second deposition preventive plates 34 and 35. Materials of the first and second deposition preventive plates 34 and 35 are ceramic (such as, quartz, alumina or the like).

The first deposition preventive plate 34 is formed in a ring shape having an inner periphery larger than the outer periphery of the substrate 31, and disposed to cover an edge portion outside the center portion of the surface of the substrate holding pedestal 32. Therefore, the particles discharged from the target 21 are not adhered to the edge portion of the surface of the substrate holding pedestal 32.

A back side of the first deposition preventive plate 34 is brought into close contact with the edge portion of the surface of the substrate holding pedestal 32. The first deposition preventive plate 34 is thermally connected to the substrate holding pedestal 32.

When the substrate 31 is placed on the center portion of the surface of the substrate holding pedestal 32, the first deposition preventive plate 34 surrounds the outside of the outer periphery of the substrate 31.

The second deposition preventive plate 35 is formed in a cylindrical shape having an inner periphery larger than an outer periphery of the target 21 and the outer periphery of the substrate 31. The second deposition preventive plate 35 is disposed between the substrate holding pedestal 32 and the cathode electrode 22, and surrounds lateral of the space between the substrate 31 and the target 21. The particles discharged from the target 21 are prevented from adhering to the wall surface of the vacuum chamber 11.

At the side of the substrate holding pedestal 32 opposite to the first deposition preventive plate 34, a second heat generating portion 33b is disposed.

Here, the second heat generating portion 33b is formed of SiC, and electrically connected to the heating power supply 17. When a direct current flows from the heating power supply 17 to the second heat generating portion 33b, the second heat generating portion 33b generates heat and then, the first deposition preventive plate 34 is heated.

When a part where heating the deposition preventive plate 36 is assumed to be a deposition preventive plate heating portion 19. The deposition preventive plate heating portion 19 includes the second heat generating portion 33b and the heating power supply 17.

Here, the first and second heat generating portions 33a and 33b are connected to each other so as to form one heat generating member 33. When a direct current flows from the heating power supply 17 to the heat generating member 33, the first and second heat generating portions 33a and 33b generate heat together and then, both of the substrate 31 and the first deposition preventive plate 34 are heated.

The present invention also includes a case where the first and second heat generating portions 33a and 33b are formed of separate heat generating members. In this case, direct current flows to the first and second heat generating portions 33a and 33b, respectively, and allows heating of the substrate 31 and the first deposition preventive plate 34, respectively.

A cooling device 38 is disposed at the side of the heat generating member 33 opposite to the substrate holding pedestal 32. The cooling device 38 circulates a temperature controlled cooling medium inside the cooling device 38. Therefore, heat generated by the heat generating member 33 does not heat the wall surface of the vacuum chamber 11.

Furthermore, the heat generating member may be disposed on an outer peripheral side surface of the second deposition preventive plate 35 so as to heat the second deposition preventive plate 35. When the second deposition preventive plate 35 is heated, PbO vapor emits from the PZT thin film, which is preliminarily adhered on an inner peripheral side surface of the second deposition preventive plate 35.

A description will be given of a film forming method using the dielectric film forming apparatus 10 of the first example.

Here, a thermally-oxidized film ($SiO_2$) of a Si substrate on which a Ti thin film as an adhesive layer and a noble metal thin film as a lower electrode layer are preliminarily laminated in this order is used as the substrate 31 to be film-formed. The noble metal thin film is a Pt or Ir thin film, and is preferentially oriented to a (111) plane.

A temperature (hereinafter referred to as a film forming temperature) at the film formation that is an appropriate temperature for forming the PZT thin film is preliminarily obtained by a test or a simulation.

A vacuum evacuation device 15 is connected to the wall surface of the vacuum chamber 11 to evacuate the inside of the vacuum chamber 11. Hereinafter, vacuum evacuation continues to maintain vacuum ambience inside the vacuum chamber 11.

First, as a preparation step, a dummy substrate that is different from the substrate 31 to be film-formed is carried into the vacuum chamber 11 while the vacuum ambience inside of the vacuum chamber 11 is maintained; then, sputtering of the target 21 is performed so as to preliminarily adhere the PZT thin film on the surfaces of the first and second deposition preventive plates 34 and 35. Subsequently, the dummy substrate is carried out to the outside of the vacuum chamber 11, while the vacuum ambience inside of the vacuum chamber 11 is maintained.

While the vacuum ambience inside of the vacuum chamber 11 is maintained, the substrate 31 to be film-formed is carried into the vacuum chamber 11. The noble metal thin film on the surface of the substrate 31 is held in the center portion on the surface of the substrate holding pedestal 32 in a direction facing the surface of the target 21.

Cooling medium under temperature control is circulated in the cooling device 38.

Figure 2:
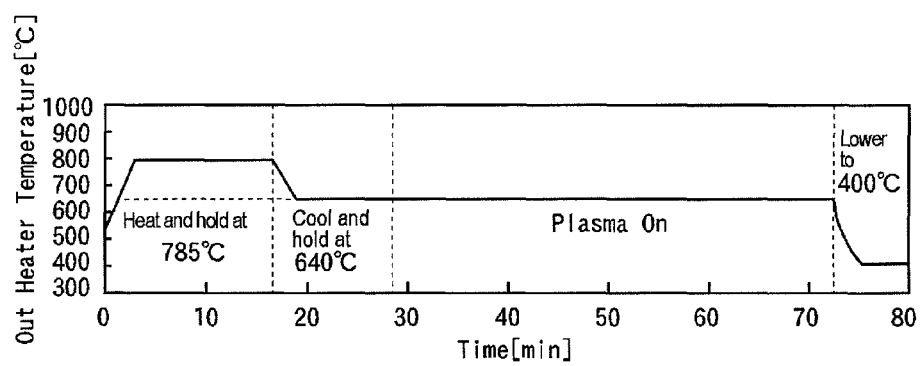
FIG. 2 is a graph showing a temperature change of a heat generating member of the dielectric film forming apparatus according to the present invention.

FIG. 2 shows a temperature change of the heat generating member 33 in a seed layer forming step and a film forming step as discussed below.

First, as the seed layer forming step, sputtering gas is introduced into the vacuum chamber 11 from the sputtering gas introduction unit 14. Here, Ar gas is used as sputtering gas. Subsequently, introduction of the sputtering gas is continued.

A direct current flows to the heat generating member 33 from the heating power supply 17 so as to set the heat generating member 33 at a temperature higher than a film formation temperature. Here, the temperature is increased to 785 degrees Celsius.

The substrate 31 and the first deposition preventive plate 34 are heated; and PbO vapor is emitted from the PZT thin film adhered to the first deposition preventive plate 34.

The emitted PbO vapor is adhered on the noble metal thin film of the surface of the substrate 31. A seed layer of PbO is formed on the noble metal thin film of the surface of the substrate 31.

After the heat generating member 33 is held at 785 degrees Celsius for a predetermined period, the heat generating member 33 is cooled to the film forming temperature. Here, the temperature is cooled to 640 degrees Celsius, which is appropriate for the PZT film formation.

Subsequently, as the film forming step, the heat generating member 33 is maintained at a temperature (the film forming temperature) of 640 degrees Celsius. While the introduction of the sputtering gas from the sputtering gas introduction unit 14 is continued, an AC voltage is applied to the cathode electrode 22 from the sputtering power supply 13. Subsequently, the sputtering gas introduced inside the vacuum chamber 11 is ionized and plasma is formed. Ions in the plasma are captured by the magnetic line generated by the magnet unit 29 and enter the surface of the target 21; and then, PZT particles are sputtered from the target 21.

A part of the PZT particles discharged from the target 21 enters the surface of the substrate 31. Because the seed layer of PbO is preliminarily formed on the noble metal thin film of the surface of the substrate 31, PbO is supplied from the seed layer; and thus, lack of Pb does not occur on the PZT thin film. Then, a dielectric film (here, the PZT film) having a (001)/(100) orientation is formed on the seed layer.

Figure 3:
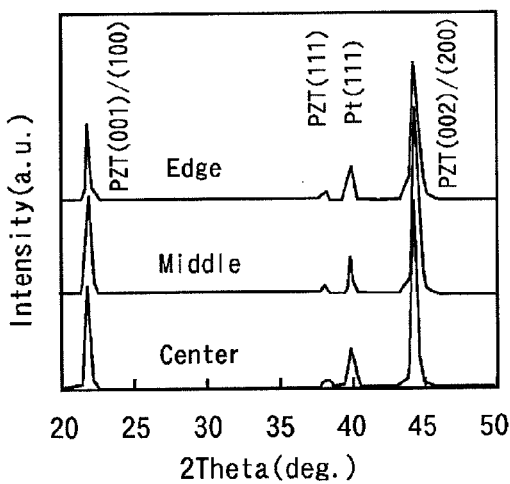
FIG. 3 is a graph showing X-ray diffraction patterns of a PZT thin film formed by the dielectric film forming apparatus according to the present invention.
Figure 4:
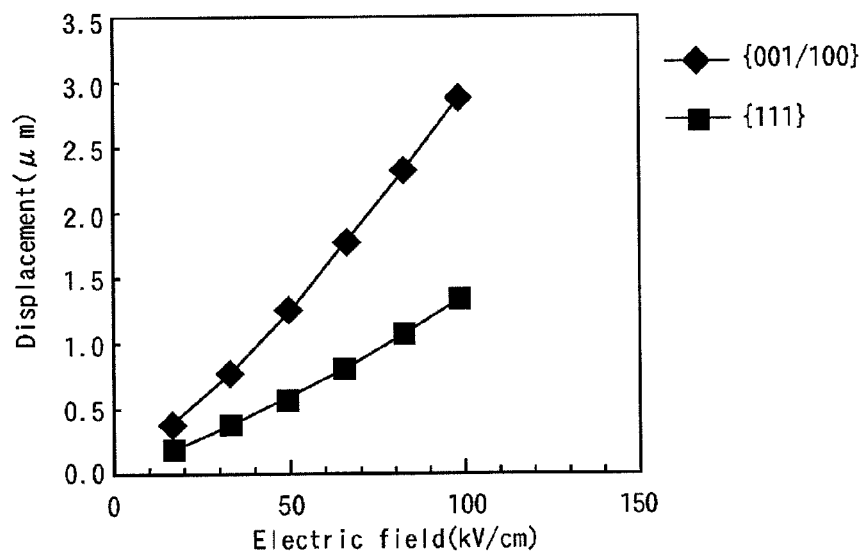
FIG. 4 is a graph showing piezoelectric characteristics of a PZT thin film having a (100)/(001) orientation and a PZT thin film having a (111) orientation.

FIG. 3 shows X-ray diffraction patterns of three portions of the center portion (Center), the edge portion (Edge), and the middle portion (Middle) between the center portion and the edge portion of a PZT thin film formed on a Pt thin film using the dielectric film forming apparatus 10 according to the present invention.

With the X-ray diffraction patterns in FIG. 3, it is understood that a PZT thin film preferentially oriented in a (100)/(001) direction is formed.

A part of the PZT particles discharged from the target 21 is adhered to the surface of the first deposition preventive plate 34, and becomes an emission source of PbO vapor in the next seed layer forming step.

After a PZT thin film having a predetermined film thickness is formed on the substrate 31, the voltage applied from the sputtering power supply 13 to the cathode electrode 22 is stopped and the introduction of the sputtering gas from the sputtering gas introduction unit 14 into the vacuum chamber 11 is halted.

The supply of the current from the heating power supply 17 to the heat generating member 33 is stopped to cool the heat generating member 33 to be a temperature lower than the film forming temperature. Here, the temperature is lowered to 400 degrees Celsius.

After the substrate 31 is cooled to be a temperature that allows a transfer by a transfer robot, the substrate 31 where the film has been formed is carried out to the outside of the vacuum chamber 11 while the vacuum ambience inside of the vacuum chamber 11 is maintained. Subsequently, another substrate 31 where the film has not been formed is carried into the vacuum chamber 11. The seed layer forming step and the film forming step, as discussed, above are repeated.

<Second Example of the Dielectric Film Forming Apparatus>

A description will be given of a structure of a second example of the dielectric film forming apparatus according to the present invention.

Figure 5:
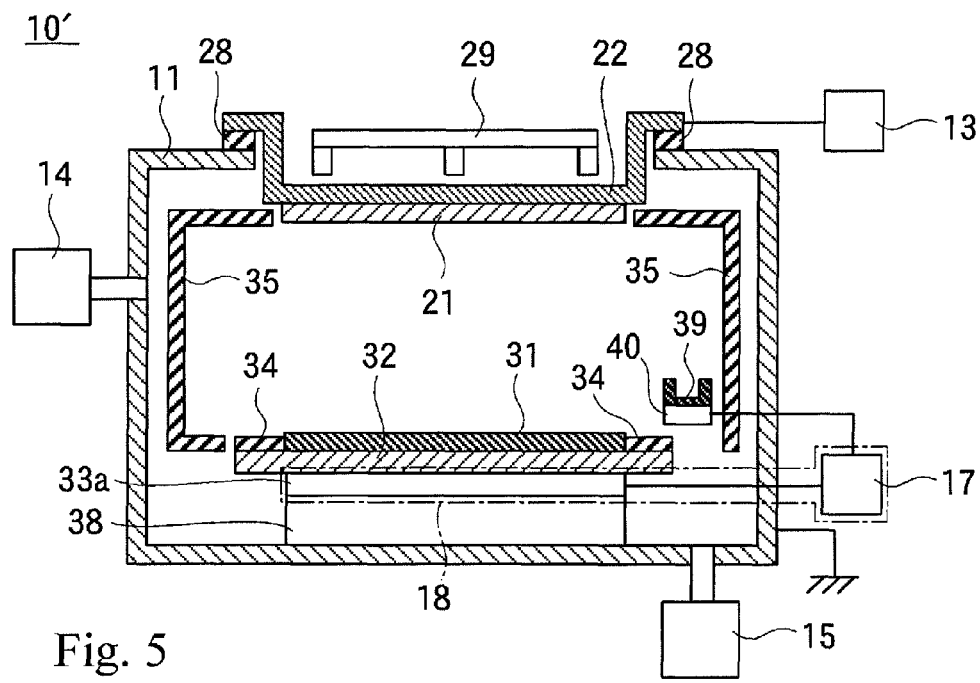
FIG. 5 is an internal configuration diagram showing a second example of a dielectric film forming apparatus according to the present invention.
Figure 6:
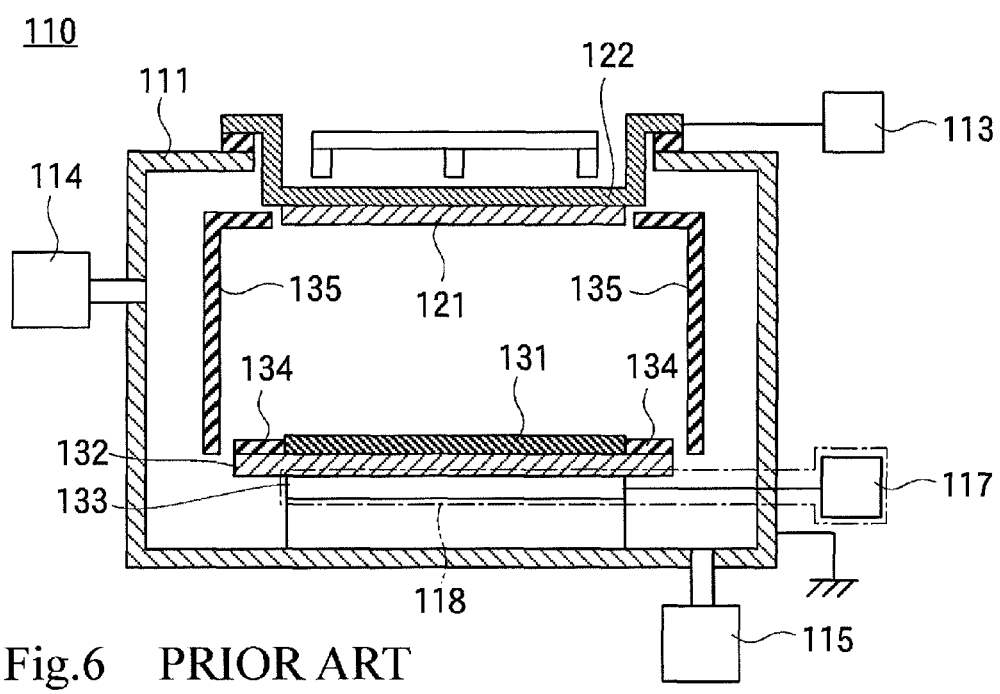
FIG. 6 is an internal configuration diagram illustrating a conventional dielectric film forming apparatus.
Figure 7:
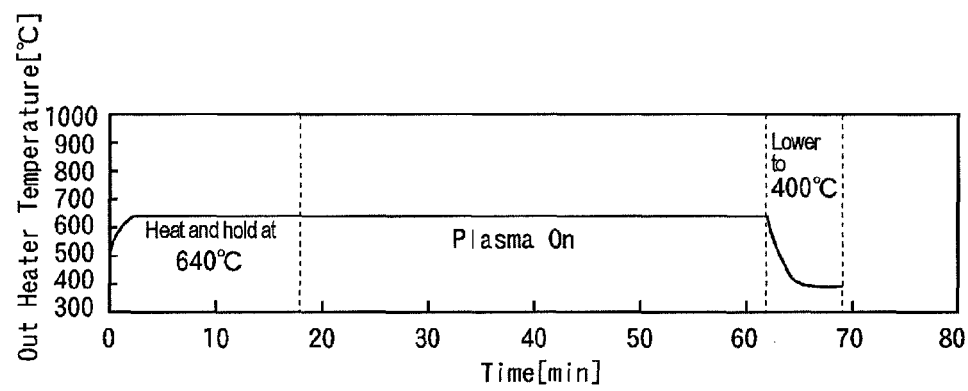
FIG. 7 is a graph showing a temperature change of a heat generating member of the conventional dielectric film forming apparatus.
Figure 8:
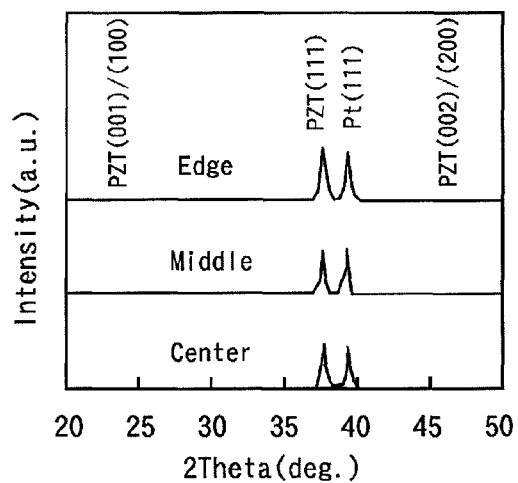
FIG. 8 is a graph illustrating X-ray diffraction patterns of PZT thin films formed by the conventional dielectric film forming apparatus.

FIG. 5 is an internal configuration diagram showing the dielectric film forming apparatus 10' in the second example. The second example of dielectric film forming apparatus 10' has reference numerals designated to correspond to or identical with elements of the dielectric film forming apparatus 10 of the first example; and thus, the explanations of such elements are omitted.

The dielectric film forming apparatus 10' of the second example includes an element source holder 39 disposed in the vacuum chamber and holds an element source made of metal composition including elements (metal elements) included in the target 21 in the metal composition's chemical structure, and an element source heating portion 40 for heating the element source held by the element source holder 39.

Here, the element source holder 39 is a crucible, and disposed inside of a space surrounded by the substrate 31, the target 21, and the first and second deposition preventive plates 34 and 35.

When the target 21 is sputtered, a part of PZT particles emitted from the target 21 is adhered to the element source disposed at an inside of the crucible.

Here, the element source heating portion 40 is an electric heater, and is mounted on the element source holder 39. The element source heating portion 40 is electrically connected to the heating power supply 17. When a direct current flows from the heating power supply 17, the element source heating portion 40 generates heat and then, the element source held by the element source holder 39 is heated.

Here, the element source contains Pb and O in its chemical structure. For example, PZT and PbO are employed. The element source emits PbO vapor here by heating.

The element source heating portion 40 of the present invention is not limited to the electric heater insofar as the element source held by the element source holder 39 is heated. The present invention includes other known heating devices (such as, an infrared lamp and a laser or the like).

A description will be given of a film forming method using the dielectric film forming apparatus 10' in the second example.

As the substrate 31 to be film-formed, a thermally-oxidized film ($SiC_2$) of a Si substrate on which a Ti thin film as an adhesive layer and a noble metal thin film as a lower electrode layer are preliminarily laminated in this order is used. The noble metal thin film is a Pt or Ir thin film preferentially oriented to a (111) plane.

A film forming temperature that is a temperature appropriate for forming the PZT thin film is preliminarily obtained by a test or a simulation.

The element source is preliminarily held by the element source holder 39. Here, the element source employs PZT.

A vacuum evacuation device 15 is connected to the wall surface of the vacuum chamber 11 to evacuate the inside of the vacuum chamber 11. Hereinafter, vacuum evacuation is continued to maintain a vacuum ambience inside of the vacuum chamber 11.

While the vacuum ambience inside of the vacuum chamber 11 is maintained, the substrate 31 to be film-formed is carried into the vacuum chamber 11. The substrate 31 is held in the center portion on the surface of the substrate holding pedestal 32 in a direction that the noble metal thin film formed on the surface of the substrate 31 face the surface of the target 21.

Cooling medium under temperature control is circulated in the cooling device 38.

As the seed layer forming step, sputtering gas is introduced into the vacuum chamber 11 from the sputtering gas introduction unit 14. Here, the sputtering gas employs Ar gas. Afterward introduction of the sputtering gas is continued.

A direct current flows to the element source heating portion 40 from the heating power supply 17 to heat the element source held by the element source holder 39. Accordingly, PbO vapor is emitted from the element source of PZT.

The emitted PbO vapor is adhered onto the noble metal thin film of the surface of the substrate 31; and a seed layer of PbO is formed on the noble metal thin film of the surface of the substrate 31.

The supply of the current from the heating power supply 17 to the element source heating portion 40 is stopped and heating of the element source is halted.

Subsequently, as the film forming step, a direct current flows to the first heat generating portion 33a from the heating power supply 17 to increase a temperature of the first heat generating portion 33a to be the film forming temperature. Here, the temperature is increased to 640 degrees Celsius. The substrate 31 held by the substrate holding pedestal 32 is heated.

The first heat generating portion 33a is maintained at a temperature (the film forming temperature) of 640 degrees Celsius. While the introduction of the sputtering gas from the sputtering gas introduction unit 14 is continued, an AC voltage is applied to the cathode electrode 22 from the sputtering power supply 13. Then, the sputtering gas introduced into the vacuum chamber 11 is ionized and plasma is formed. Ions in the plasma are captured by the magnetic line generated by the magnet unit 29 and enter the surface of the target 21; and thus, PZT particles are sputtered from the target 21.

A part of the PZT particles discharged from the target 21 enters the surface of the substrate 31. The seed layer of PbO is preliminarily formed an the Pt thin film of the substrate 31, so that PbO is supplied from the seed layer; and lack of Pb does not occur on the PZT thin film. Thus, a dielectric film (here, the PZT film) having a (001)/(100) orientation is formed on the seed layer.

A part of the PZT particles discharged from the target 21 is adhered to the element source held by the element source holder 39, and becomes an emission source of PbO vapor in the next seed layer forming process.

After a PZT thin film having a predetermined film thickness is formed on the substrate 31, the voltage applied from the sputtering power supply 13 to the cathode electrode 22 is stopped and the introduction of the sputtering gas from the sputtering gas introduction unit 14 into the vacuum chamber 11 is halted. The supply of the current from the heating power supply 17 to the first heat generating portion 33a is stopped to cool the first heat generating portion 33a to be a temperature lower than the film forming temperature. Here, the temperature is lowered to be 400 degrees Celsius.

After the substrate 31 is cooled to a temperature that allows a transfer by a transfer robot, the substrate 31 where the film has been formed carried out to the outside of the vacuum chamber 11 while the vacuum ambience inside of the vacuum chamber 11 is maintained. Subsequently, another substrate 31 where the film has not been formed is carried into the vacuum chamber 11, and the seed layer forming step and the film forming step, as discussed above, are repeated.

DESCRIPTION OF REFERENCE NUMERALS 10 and 10' dielectric film forming apparatus
11 vacuum chamber
13 sputtering power supply
14 sputtering gas introduction unit
18 substrate heating portion
19 deposition preventive plate heating portion
21 target
31 substrate
32 substrate holding pedestal
34 deposition preventive plate (first deposition preventive plate)
39 element source holder
40 element source heating portion

What is claimed is:

1. A method for forming a dielectric film using a dielectric film forming apparatus including
    a vacuum chamber;
    a target disposed inside the vacuum chamber;
    a substrate holding pedestal for holding substrate, disposed in a position facing the target;
    a substrate heating portion for heating the substrate supported by the substrate holding pedestal;
    a sputtering power supply for applying a voltage to the target;
    a sputtering gas introduction unit for introducing sputtering gas into the vacuum chamber;
    a deposition preventive plate disposed in a position where particles discharged from the target adhere inside the vacuum chamber; and
    a deposition preventive plate heating portion for heating the deposition preventive plate,
    the method, comprising the steps of:
    preliminarily determining a film forming temperature;
    forming a seed layer, the step of forming the seed layer including the steps of: introducing sputtering gas into the vacuum chamber from the sputtering gas introduction unit, heating the deposition preventive plate to a temperature higher than a film forming temperature, and emitting vapor from a thin film adhered to the deposition preventive plate so as to form a seed layer on the substrate; and
    forming a film, the step of forming the film including the steps of setting the substrate to be the film forming temperature, applying a voltage to the target from the sputtering power supply, and sputtering the target so as to form a dielectric film on the seed layer of the substrate.

2. The method for forming a dielectric film according to claim 1, further comprising the steps of:
    using the target formed of lead zirconate titanate (PZT), including Pb and O in chemical structure of a film form on the deposition preventive plate,
    emitting vapor of PbO by heating the deposition preventive plate.

3. The method for forming a dielectric film according to claim 1, wherein the deposition preventive plate has a ring shape, and the deposition preventive plate is disposed so as to surround an outside of an outer periphery of the substrate, the substrate being held by the substrate holding pedestal.

4. The method for forming a dielectric film according to claim 2, wherein the deposition preventive plate has a ring shape, and the deposition preventive plate is disposed so as to surround an outside of an outer periphery of the substrate, the substrate being held by the substrate holding pedestal.

* * * * *